United States Patent
Renneke et al.

(10) Patent No.: US 12,068,754 B2
(45) Date of Patent: Aug. 20, 2024

(54) INPUT STAGE FOR A SAMPLE ANALOG TO DIGITAL CONVERTER, SAMPLE ANALOG TO DIGITAL CONVERTER AND PROCEDURE FOR TESTING AN ANALOG TO DIGITAL CONVERTER

(71) Applicant: Infineon Technologies AG, Neubiberg (DE)

(72) Inventors: Florian Renneke, Münster (DE); Andreas Fugger, Villach (AT); Jaafar Mejri, Ottobrunn (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 83 days.

(21) Appl. No.: 17/815,057

(22) Filed: Jul. 26, 2022

(65) Prior Publication Data
US 2023/0045504 A1 Feb. 9, 2023

(30) Foreign Application Priority Data
Jul. 27, 2021 (DE) .......................... 102021119375.3

(51) Int. Cl.
*H03M 1/12* (2006.01)
*H03M 1/10* (2006.01)
*H03M 1/38* (2006.01)
*H03M 1/46* (2006.01)

(52) U.S. Cl.
CPC ....... *H03M 1/1255* (2013.01); *H03M 1/1033* (2013.01); *H03M 1/1071* (2013.01); *H03M 1/1245* (2013.01); *H03M 1/38* (2013.01); *H03M 1/466* (2013.01)

(58) Field of Classification Search
CPC .... H03M 1/1255; H03M 1/1071; H03M 1/38; H03M 1/1033; H03M 1/1245; H03M 1/466
See application file for complete search history.

(56) References Cited

U.S. PATENT DOCUMENTS

| 9,369,140 | B1 | 6/2016 | Sundaresan et al. |
| 10,079,610 | B2 | 9/2018 | Bogner et al. |
| 10,886,931 | B1 * | 1/2021 | Narwal ................. H03M 1/122 |
| 10,916,321 | B2 * | 2/2021 | Wappis ............... H03M 1/1245 |

\* cited by examiner

*Primary Examiner* — Khai M Nguyen
(74) *Attorney, Agent, or Firm* — Slater Matsil, LLP

(57) ABSTRACT

An input stage for an analog/digital converter, an analog/digital converter and a method for testing analog/digital converters with successive approximation are disclosed. At an input stage, an input signal is supplied via a first transistor arrangement of a sampling capacitor arrangement. The sampling capacitor arrangement can be optionally connected to ground or to a reference voltage by way of a second transistor arrangement and a switch apparatus.

19 Claims, 5 Drawing Sheets

INPUT STAGE FOR A SAMPLE ANALOG TO DIGITAL CONVERTER, SAMPLE ANALOG TO DIGITAL CONVERTER AND PROCEDURE FOR TESTING AN ANALOG TO DIGITAL CONVERTER

This application claims the benefit of German Patent Application No. 102021119375.3, filed on Jul. 27, 2021, which application is hereby incorporated herein by reference.

TECHNICAL FIELD

The present application relates to input stages for sampled analog/digital converters, sampled analog/digital converters and methods for testing an analog/digital converter with successive approximation, as well as to a corresponding analog/digital converter with successive approximation.

BACKGROUND

Analog/digital converters are used in a wide range of applications to convert analog signals into digital signals that are then processed further. One example is sensor applications in which a sensor outputs an analog signal that is then converted into a digital signal. Another example is that of monitoring applications in which voltages or currents arising in a system are digitized for monitoring purposes and are then further processed, for example compared with setpoint values. In such applications, comparatively high voltages that are higher than voltages that are used in components of the analog/digital converter must sometimes be converted.

Some analog/digital converters operate continuously in time, i.e. an applied analog signal is continuously converted into a digital signal. Another type of analog/digital converter are sampled analog/digital converters in which the analog input signal is sampled, for example on the basis of a clock signal, and the sample signal is then converted into a digital signal. In many applications a capacitor is charged up to an input voltage that is to be converted, and then disconnected from the input voltage for this kind of sampling. The conversion process itself then takes place after the disconnection. In some types of analog/digital converter, such as analog/digital converters with successive approximation, a switched capacitor arrangement is used within the converter for a digital/analog conversion. Variations in the capacitance ratio between the capacitance used for sampling and the capacitor arrangement used for the digital/analog conversion can affect the accuracy of the converter.

Furthermore, some analog/digital converters use a reference voltage that is, for example, derived from a bandgap voltage. When providing this reference voltage, offsets can arise, for example as a result of buffering.

SUMMARY

An input stage according to claim 1, a sampled analog/digital converter according to claim 8, a method for testing an analog/digital converter according to Claim 10 and an analog/digital converter according to claim 15 are provided. The subsidiary claims define further embodiments.

According to one exemplary embodiment, an input stage for a sampled dialogue/digital converter is provided, comprising:
  a first input for receiving an analog input signal,
  a second input for receiving a sampling control signal,
  a first transistor arrangement, wherein a first load terminal of the first transistor arrangement is coupled to the first input, a second load terminal of the first transistor arrangement is coupled to a first terminal of a sampling capacitor arrangement, and a control terminal of the first transistor arrangement is coupled to the second input,
  a second transistor arrangement, wherein a second load terminal of the first transistor arrangement is coupled to the first terminal of the sampling capacitor arrangement, a second load terminal of the second transistor arrangement is coupled to a first node, and a control terminal of the second transistor arrangement is coupled to the second input, and
  a switch apparatus that is configured optionally to couple the first node to ground or to a reference voltage.

According to another exemplary embodiment, a sampled analog/digital converter is provided with an input stage of this type.

According to a further exemplary embodiment, a method for testing an analog/digital converter with successive approximation is provided, and comprises an input node, a converter core, a sampling capacitor arrangement coupled between the input node and an input of the converter core, a further capacitor arrangement coupled between the input of the converter core and a ground, and a reference voltage generation apparatus for generating a reference voltage for the analog/digital converter, wherein the method comprises:
  applying the reference voltage to the input node,
  converting the reference voltage into a digital value, and
  determining a capacitance ratio between a capacitance of the sampling capacitor arrangement and the further capacitance of the further capacitor arrangement on the basis of the digital value.

Finally, an analog/digital converter with successive approximation is provided, comprising: an input node,
  a converter core,
  a sampling capacitor arrangement coupled between the input node and an input of the converter core,
  a further capacitor arrangement coupled between the input of the converter core and a ground,
  a reference voltage generation apparatus for generating a reference voltage for the analog/digital converter, and
  a test controller that is configured to control the analog/digital converter for:
  applying the reference voltage to the input node,
  converting the reference voltage into a digital value, and
  is configured to determine a capacitance ratio between a capacitance of the sampling capacitor arrangement and a further capacitance of the further capacitor arrangement on the basis of the digital value.

The above summary only has the purpose of providing a brief overview of some embodiments, and is not to be considered restrictive, since other exemplary embodiments can exhibit other features.

DETAILED DESCRIPTION OF ILLUSTRATIVE EMBODIMENTS

Figure 1:
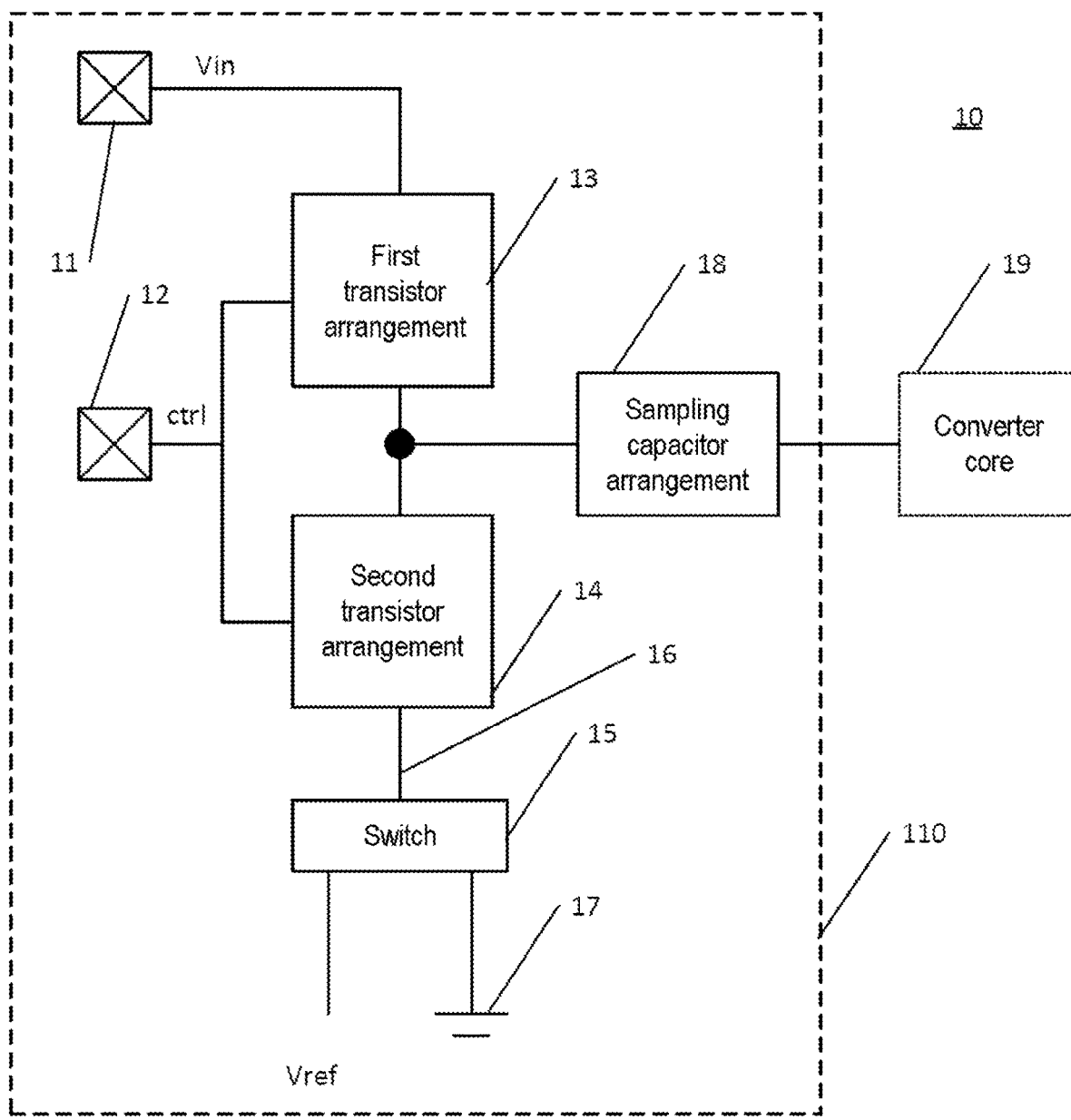
FIG. 1 is a block diagram of an analog/digital converter according to one exemplary embodiment, with an input stage according to one exemplary embodiment.

Various exemplary embodiments are explained in detail below with reference to the figures. These exemplary embodiments are only used for illustration, and are not to be applied restrictively. Thus, a description of an exemplary embodiment with a large number of features (for example components, elements, method steps, procedures and the like) is not to be interpreted to mean that all of these features are necessary for the implementation. In other exemplary embodiments, rather, some features can be omitted and/or replaced by alternative features. What is more, further features, in addition to the explicitly illustrated and described features, may also be provided, for example features of conventional analog/digital converters. Exemplary embodiments described below thus relate to input stages for analog/digital converters and to methods for testing analog/digital converters and corresponding analog/digital converters. Other components and aspects of these analog/digital converters, for example a normal operation of the analog/digital converter outside of testing, can be implemented in the conventional manner.

Features of different exemplary embodiments can be combined, unless otherwise stated. Variations and derivations that are described for one of the exemplary embodiments can also be applied to other exemplary embodiments, and are therefore not described repeatedly.

Connections or couplings that are described here relate to electrical connections or couplings, unless another meaning is explicitly stated. Connections or couplings of this type can be modified, for example through the addition of components or the removal of components, provided the fundamental function of the connection or coupling, for example the provision of the signal, the transmission of information, or the provision of a voltage supply or current supply, are retained.

Switches or switch arrangements that comprise multiple switches are used in various exemplary embodiments. Switches of this type can be realized with the aid of transistors such as bipolar transistors, field-effect transistors, or insulated-gate field-effect transistors. Depending on the voltage and current that are applied to or carried by the transistor, transistors of this type can also be realized by means of multiple single transistors, for example stacked single transistors. Transistors, including transistor arrangements, are generally described as having two load terminals and a control terminal. The transistor can be switched off (blocking) or on (conductive) by applying the control signal to the control terminal. In the on state the transistor provides an electrical connection between the load terminals, and in the off state it is essentially insulating. In the case of bipolar transistors, the base is the control terminal, while the collector and emitter are the load terminals. In the case of field effect transistors, the gate is the control terminal, while the source and drain are the load terminals. In the case of insulated gate bipolar transistors, the gate is the control terminal, while the collector and emitter are the load terminals.

Capacitors illustrated in the figures can also be implemented by a capacitor arrangement with one or a plurality of capacitors. Multiple capacitors can, for example, be connected in parallel and/or in series in order to reach a desired capacitance value or a desired voltage rating. A capacitor arrangement can also consist of a plurality of switchable capacitors in order to provide an adjustable capacitance. The representation of a single capacitor in the figures and in the description is therefore not to be understood to mean that the respective element can only be realized using a single, discrete capacitor.

For example, it can sometimes be desirable for test purposes to apply a reference voltage, for example a reference voltage which otherwise is used internally for conversion by an analog/digital converter, to an input of the analog/digital converter and to convert it into a digital value. In some implementations, reference voltages of this type are assigned to a voltage domain with a comparatively low voltage, for example less than 5 V, or less than 3.3 V.

On the other hand, analog/digital converters are sometimes used to convert higher voltages, for example voltages greater than 10 V, greater than 20 V, or more, i.e. voltages of a higher voltage domain, with higher voltages. If the reference voltage is now simply applied to the same input of the analog/digital converter as other higher voltages to be converted, problems can arise in such situations, since crosstalk can arise from the voltage domain with the higher voltage to the voltage domain with the lower voltage.

The provision of a complete, dedicated input stage for such a reference voltage would, on the other hand, entail a relatively large surface usage on a chip used for the implementation. Input stages of some exemplary embodiments are described below, with which both higher voltages and lower reference voltages can be supplied for conversion to one analog/digital converter.

FIG. 1 shows a block diagram of a sampled analog/digital converter 10 according to one exemplary embodiment, with an input stage no according to one exemplary embodiment. The input stage no comprises a first input 11 to which an analog input voltage $V_{in}$ is supplied, which in normal operation of the analog/digital converter no should be converted into a digital value that represents the analog input voltage $V_{in}$. The input stage no furthermore has a second input 12 to which a sampling control signal ctrl can be supplied. Sampling the input signal $V_{in}$ for subsequent conversion can be controlled through the sampling control signal ctrl.

The first input 11 is connected to a first terminal of a sampling capacitor arrangement 18 via a first transistor arrangement 13. The first terminal of the sampling capacitor arrangement 18 is furthermore connected via a second transistor arrangement 14 to a node 16. The first node 16 can optionally be connected to ground 17 or to a reference voltage $V_{ref}$ via a switch apparatus 15. The reference voltage \T$_{ref}$ can be a reference voltage used internally by the analog/digital converter 10 in normal operation of the analog/digital converter 10, being generated from or corresponding to, for example, a bandgap voltage, as will be explained in more detail later with reference to examples. The reference voltage \T$_{ref}$ can thus be used, as explained later, for the operation of a digital/analog converter capacitor arrangement in an analog/digital converter with successive approximation.

In normal operation of the analog/digital converter 10, the node 16 is connected to ground 17 via the switch 15. To sample the input voltage $V_{in}$, the first transistor arrangement 13 is switched into the conductive state and the second transistor arrangement 14 into the blocking state by means of the sampling control signal ctrl in a first sampling phase, so that the first terminal of the sampling capacitor arrangement 18 is placed at $V_{in}$ and the sampling capacitor arrangement 18 is correspondingly charged. In a second sampling phase, the first transistor arrangement 13 is then switched into the blocking state and the second transistor arrangement 14 into the conductive state, so that the sampling capacitor arrangement 18 is disconnected from the first input 11, and a conversion is carried out by a converter core 19 that is connected to a second terminal of the sampling capacitor arrangement 18. Converter core here refers to the part of the analog/digital converter that follows the sampling capacitor arrangement 18; its implementation depends on the respective type of the analog/digital converter. An example of an analog/digital converter with successive approximation is explained later. Other types of analog/digital converter that use a sampling capacitor arrangement to sample an input signal can, however, also be used.

In order to now convert the reference voltage $V_{ref}$, the node 16 is connected via the switch apparatus 15 to $\backslash T_{ref}$, and the second transistor arrangement is switched into the conductive state, so that $\backslash T_{ref}$ is applied to the sampling capacitor arrangement 18. The first transistor arrangement 13 is here switched into the blocking state. The sampling capacitor arrangement 18 is thus charged to $\backslash T_{ref}$, and $\backslash T_{ref}$ can be converted into a digital signal by the analog/digital converter 10. The input voltage $V_{in}$ can belong to a voltage domain with higher voltages, while the reference voltage $V_{ref}$ can belong to a voltage domain with lower voltages. The first transistor arrangement 13 and the second transistor arrangement 14 are dimensioned for voltages of the voltage domains with higher voltages, such as $V_{in}$. The switch arrangement 15 can be dimensioned for voltages of the lower voltage domain to which $V_{ref}$ belongs. The voltage domains are separated from one another by the illustrated arrangement, at least by the first transistor arrangement 13 and the second transistor arrangement 14. On the other hand, an additional input stage for the application of $\backslash T_{ref}$ is not necessary, since $\backslash T_{ref}$ is applied to the first terminal of the sampling capacitor arrangement 18 through the second transistor arrangement which is, in any case, necessary when operating for the conversion of $V_{in}$. Only the switch apparatus 15 is thus required in addition, so that the voltage $\backslash T_{ref}$ can also be applied to the sampling capacitor arrangement 18. Since the switch apparatus 15 can be dimensioned for lower voltages, it can be implemented with a comparatively low requirement for surface area.

Different exemplary implementations for the input stage no will now be explained with reference to FIGS. 2-4. To avoid repetition, the reference sign in FIGS. 2-4 indicate identical or corresponding elements that are not repeatedly described. In addition, to avoid repetitions in the description of FIGS. 2-4, reference is made in part to the above description of FIG. 1.

Figure 2:
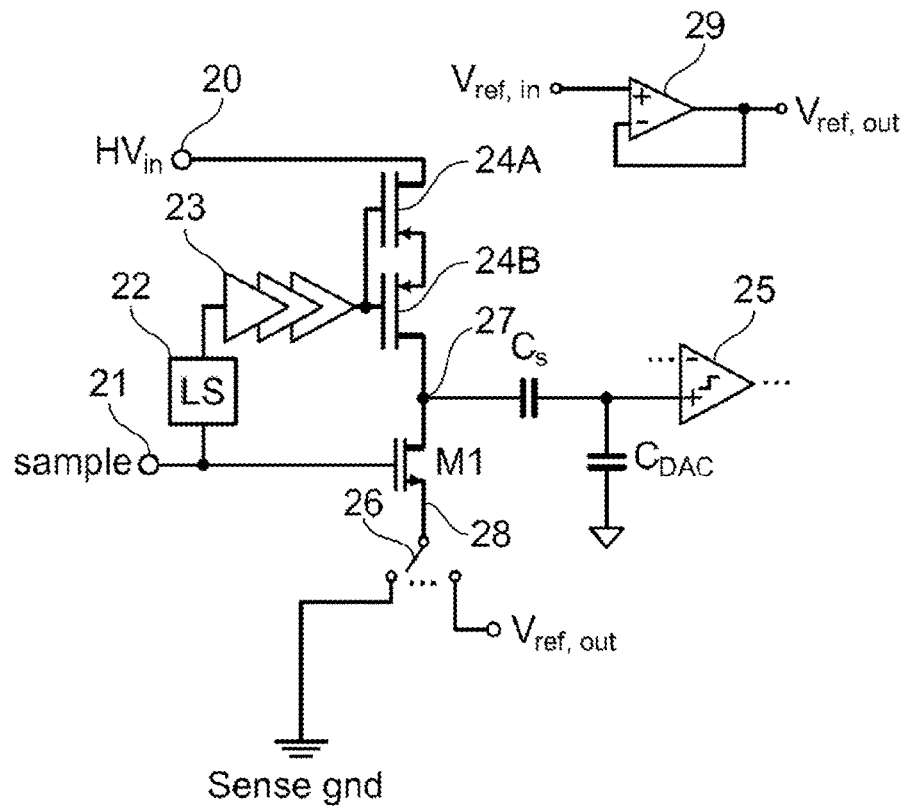
FIG. 2 is a circuit diagram of an analog/digital converter according to one exemplary embodiment.

FIG. 2 shows an analog/digital converter with successive approximation according to one exemplary embodiment. The digital/analog converter of FIG. 2 comprises a first terminal 20 for receiving an analog input signal $HV_{in}$ that is to be converted. The signal $HV_{in}$ can have relatively high voltages, for example greater than 10 V, greater than 20 V, or more. The first input is connected to a node 27 via two PMOS transistors 24A, 24B, with which a first terminal of a sampling capacitor $C_S$ is also connected. The PMOS transistors 24A, 24B represent an example of the first transistor arrangement 13 of FIG. 1, and the sampling capacitor $C_S$ represents an example of the sampling capacitor arrangement 18 of FIG. 1.

As shown in FIG. 2, the PMOS transistors 24A, 24B are coupled to one another with their source terminals and are therefore, so to speak, connected in opposed series. This has the effect that body diodes of the PMOS transistors 24A, 24B are of opposite polarities and thus, when the PMOS transistors 24A, 24B are switched off (switched into the blocking state), one of the body diodes always has the polarity of the blocking direction, and therefore current cannot flow through the series circuit of the PMOS transistors 24A, 24B.

The PMOS transistors 24A, 24B are controlled by a sampling control signal sample that is present at a second input 21. The second input 21 is connected for this purpose via a level changer 22 and a driver stage 23 to gate terminals of the PMOS transistors 24A, 24B. The driver stage 23 generates, for example by means of a charge pump, a suitable gate voltage for switching the PMOS transistors 24A, 24B on and off, for example optionally to $HV_{in}$ or to reduced $HV_{in}$, to set a clamping voltage $V_{clamp}$, wherein this voltage can be independent of the voltage at a drain terminal of the PMOS transistor 24B.

The node 27 is furthermore connected via an NMOS transistor M1 to a node 28. The NMOS transistor M1 is an example of the second transistor arrangement 14 of FIG. 1, and the node 28 is an example of the node 16 of FIG. 1. The node 28 is connected optionally to a "Sense gnd" ground or to a reference voltage $V_{ref,out}$, via a changeover switch 26 that is an example of the switch apparatus 15 of FIG. 1. The reference voltage $V_{ref,out}$ is a reference voltage that is used internally for conversion purposes in the analog/digital converter. The reference voltage $V_{ref,out}$ is generated from an input reference voltage $V_{ref,in}$, via a buffer 29. $V_{ref,in}$ can, for example be generated as a bandgap voltage in the conventional manner, or derived from such a bandgap voltage, or it can also be received from an external voltage source.

As an example of an implementation of a converter core, a comparator 25 and a digital/analog converter capacitor CDAC of an analog/digital converter with successive approximation is represented in FIG. 2. The converter capacitor CDAC can, for example, symbolize an arrangement of parallel capacitors that can be connected optionally to ground or to $V_{ref,out}$.

The reference voltage $V_{ref,out}$ belongs to a voltage domain with a lower voltage than the input voltage $HV_{in}$, and the switch 26 can also be implemented using transistors that are dimensioned for the voltage domain with the lower voltage, and therefore only use a comparatively small surface area. The switch 26 is thereby protected by the transistor M1 that is dimensioned for the voltage $HV_{in}$. In this way, a large additional surface area requirement is not necessary in order to be able to apply $V_{ref,out}$ to the node 27, since the transistor M1 in any case has to be present in order to be able to place the node 27 at the "Sense gnd" ground during normal sampling of the signal $V_{in}$.

Due to the different polarity of the transistors 24A, 24B on the one hand (PMOS) and of the transistor M1 on the other hand (NMOS), the sampling control signal sample switches the transistor M1 into the blocking state if the transistors 24A, 24B are switched into the conductive state, and vice versa. Dead times, in which all the transistors are in the blocking state, can also be provided here, as in conventional circuits.

Figure 3:
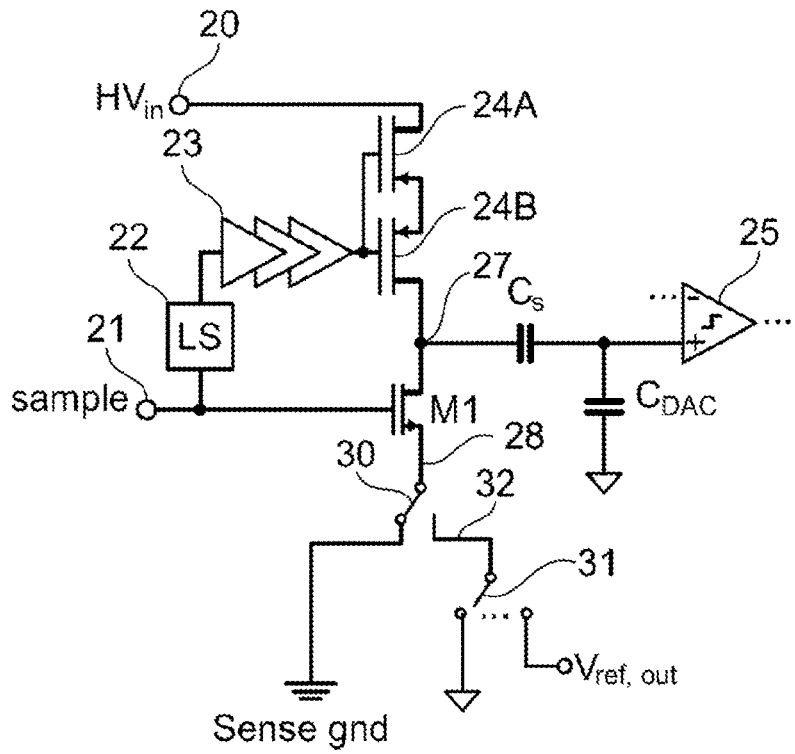
FIG. 3 is a circuit diagram of an analog/digital converter according to a further exemplary embodiment.

FIG. 3 represents a variant of FIG. 2. In the analog/digital converter of FIG. 3, a switch apparatus that is connected to the node 28 comprises a first switch 30 and a second switch 31. By means of the first switch 30, the node 28 can optionally be connected to the "Sense gnd" ground or to a node 32. The node 32 can then optionally be connected to the reference voltage $V_{ref,out}$ or to a further ground by means of a changeover switch 21. This further ground can differ from "Sense gnd", and can, for example, be an internal ground of the analog/digital converter, for example an internal analog ground, for example a ground used for the buffer 29 or a ground of a digital part (digital VSS) that is well-screened from interference. It can also, however, be identical to "Sense gnd".

In this way the node 32 can be placed at ground by the switch 31 when the signal $HV_{in}$ is sampled and converted during normal operation of the analog/digital converter, which provides additional insulation between the voltage domains.

Figure 4:
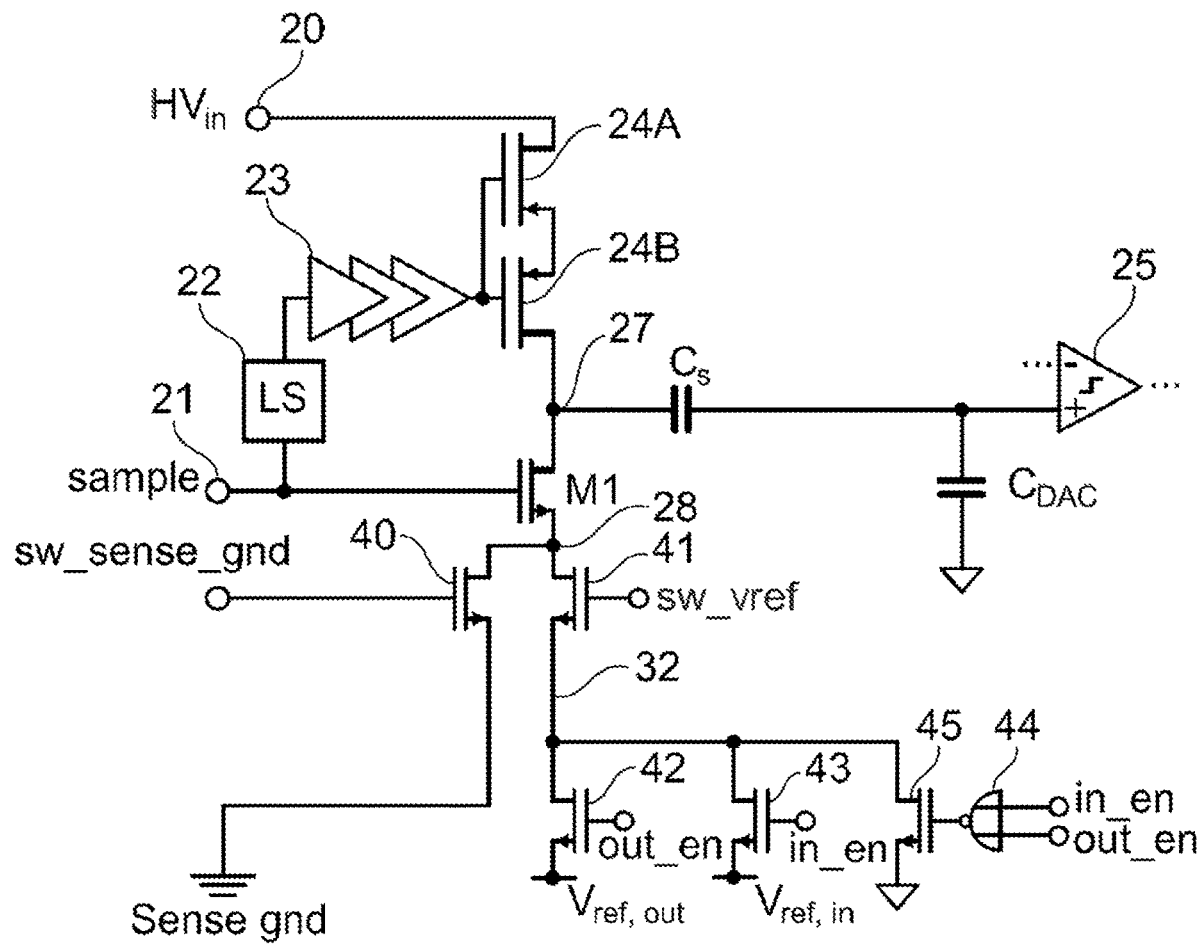
FIG. 4 is a circuit diagram of an analog/digital converter according to a further exemplary embodiment.

FIG. 4 represents a variant of FIGS. 2 and 3. This shows on the one hand a circuit implementation of the switches 30 and 31 of FIG. 3, and, on the other hand, enables the voltage $V_{ref,in}$ to be applied to the node 27 via the transistor M1 as well as the application of the voltage $V_{ref,out}$. This enables further tests for the analog/digital converter, and in particular, as explained in more detail below, makes it possible for an offset caused by the buffer 29 to be detected.

In FIG. 4 the switch 30 is realized by a first transistor 40 and a second transistor 41. A corresponding realization is also possible for the switch 26 of FIG. 3. Controlled by a signal sw_sense_gnd, the node 28 can be connected via the transistor 40 to the "Sense gnd" ground, and, controlled by a signal SW_V$_{ref}$, the node 28 can be connected to the node 32 via the transistor 41. The signals SW_Sense_GND and SW_V$_{ref}$ are connected in such a way here that only one of the transistors 40, 41 is ever switched into the conductive state, and the other transistor is switched into the blocking state. It is in particular possible in normal operation, when the signal $HV_{in}$ is to be converted, for the transistor 40 to be switched into the conductive state and the transistor 41 into the blocking state, and for the transistor 41 to be switched into the conductive state in a test operation for applying the reference voltage $V_{ref,in}$ or $V_{ref,out}$, while the transistor 40 is switched into the conductive states for discharging the node 27 while the transistor M1 is conductive.

Controlled by a signal out_en, the node 32 can be connected via a transistor 42 to the reference voltage $V_{ref,out}$ in order to apply this for conversion to the node 27 and thus to the sampling capacitor $C_S$. Controlled by a signal in_en, the node 32 can be connected via a transistor 43 to the reference voltage $V_{ref,in}$. If neither the transistor 42 is switched into the conductive state by the signal out_en, nor the transistor 43 by the signal in_en, a transistor 45 is switched into a conductive state via a logic gate 44, in order to place the node 32 at ground. The transistors 42 and 45 thus implement the switch 31 of FIG. 3, with the additional possibility of also supplying $V_{ref,in}$ by means of the transistor 43.

In this and other exemplary embodiments that enable the application of both $V_{ref,in}$ and of $V_{ref,out}$, precharging with $V_{ref,out}$ can initially take place on the application of $V_{ref,in}$. Thus, in the case of FIG. 4, the node 27 can first be pre-charged to $V_{ref,out}$ via the transistors 42, 41 and M1 before $V_{ref,in}$ is applied via the transistors 43, 41 and M1. This can reduce problems that can arise as a result of a high output impedance for $V_{ref,in}$.

The use of a reference voltage for testing an analog/digital converter will now be explained in more detail using the example of an analog/digital converter with successive approximation.

Figure 5:
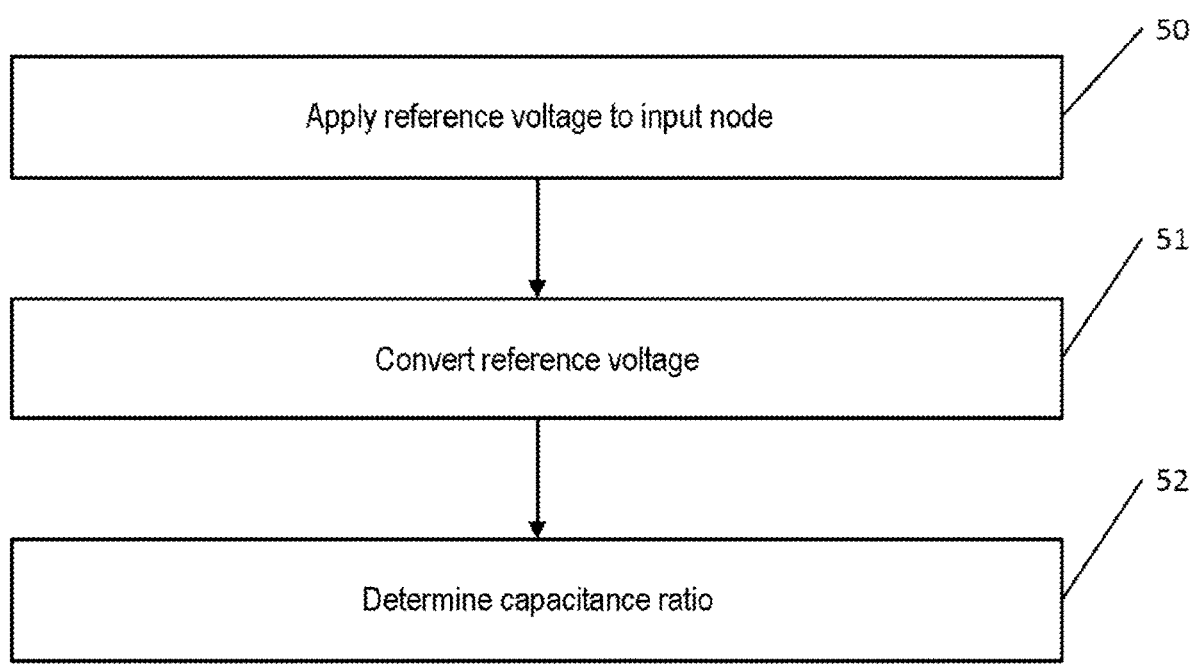
FIG. 5 is a flow diagram to illustrate a method according to some exemplary embodiments.

FIG. 5 shows a flow diagram to illustrate a method according to some exemplary embodiments. At 50 a reference voltage is applied to an input node of an analog/digital converter with successive approximation, for example reference voltage $V_{ref,out}$ or, additionally, the reference voltage $V_{ref,in}$ to the node 27 of FIG. 4. The applied reference voltage is converted into a digital value at 51. At 52 a capacitance ratio of a sampling capacitor (for example $C_S$ of FIG. 4) to a digital/analog converter capacitor (for example $C_{DAC}$ of FIG. 4) is determined on the basis of the converted reference voltage. Deviations from a target capacitance ratio can thus be detected. On the basis of the capacitance ratio, a gain of the converter can also be determined, and it is also possible here to detect variations from a target value. In converters that provide corresponding compensation, these kinds of deviations can then be compensated for.

This will now be explained in more detail with reference to FIGS. 6 and 7.

Figure 6:
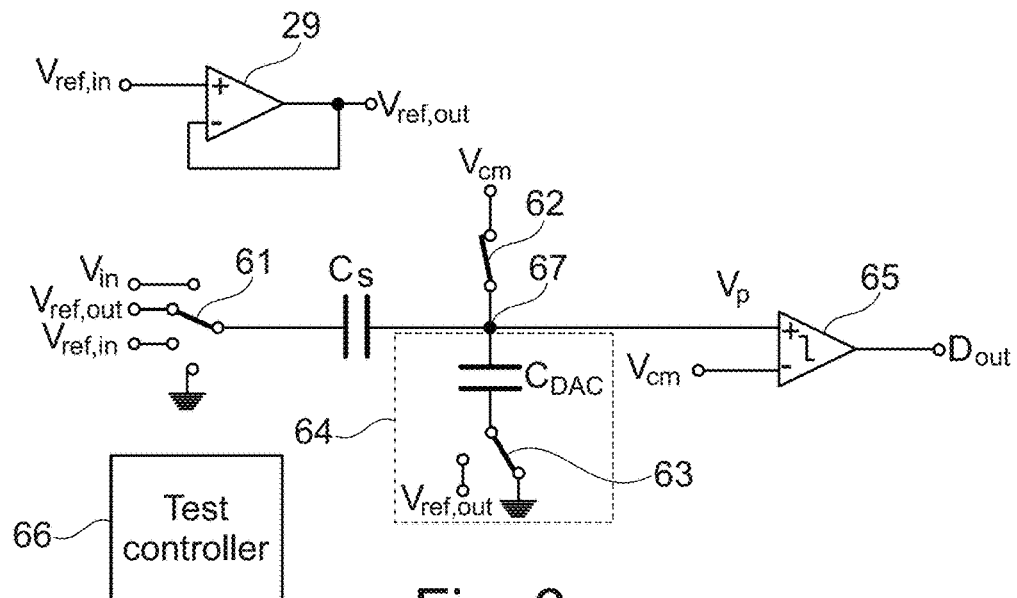
FIG. 6 is a circuit diagram of an analog/digital converter according to one exemplary embodiment.

FIG. 6 shows an exemplary embodiment of an analog/digital converter with successive approximation according to one exemplary embodiment. The analog/digital converter of FIG. 6 uses the reference voltage $V_{ref,out}$ that has already been discussed, which is generated by means of the buffer 29 from the reference voltage $V_{ref,in}$. An input voltage to be converted $V_{in}$, the voltage $V_{ref,in}$, the voltage $V_{ref,out}$ or ground is then optionally applied to a first terminal of a sampling capacitor $C_S$ via a changeover switch 61. The changeover switch 61 can, for example, be implemented by means of the input stage illustrated in FIG. 4, with which optionally the input signal to be converted $HV_{in}$, "Sense gnd", $V_{ref,out}$ or $V_{ref,in}$ is applied to the node 27 and thus to the first terminal of the sampling capacitor $C_S$. Other implementations, for example separate input stages for $V_{in}$ and the reference voltages $V_{ref,in}$ and $V_{ref,out}$ can however also be used, or a common input stage can also be used if different voltage domains, as explained above, are not present. The switch 61 and the test procedure can be controlled by a test controller 66. This test controller 66 can be part of the controller that generally controls the analog/digital converter of FIG. 6.

A second terminal of the sampling capacitor $C_S$ connected to a node 67. The node 67 is connected to a positive input (+) of a comparator arrangement 65. A voltage at the positive input of the comparator arrangement 65 is identified as $V_p$.

The node 67 is furthermore connected via a switch 62 to a common mode voltage $V_{cm}$. Finally, the node 67 is connected to a first terminal of a converter capacitor $C_{DAC}$ of a digital/analog converter arrangement 64. A second terminal of the converter capacitor $C_{DAC}$ can be connected via a switch 63 optionally to ground or to the reference voltage $V_{ref,out}$ Depending on the desired resolution, the converter capacitor $C_{DAC}$ can be realized here as a capacitor bank with multiple capacitances, wherein each of the capacitances can optionally be connected to the reference voltage $V_{ref,out}$ or to ground. The capacitance ratio of these capacitances can be 1:2:4:8 . . . , as in conventional analog/digital converters with successive approximation.

A negative terminal of the comparator 65 is connected to the common mode voltage $V_{cm}$. The digital output signal $D_{out}$ can be accessed at an output of the comparator arrangement 65. FIG. 6 here is only a schematic illustration of the analog/digital converter with successive approximation. The normal operation of the analog/digital converter of FIG. 6 for converting the input signal $V_{in}$ will first be briefly explained.

When converting $V_{in}$, $V_{in}$ is first applied to the first terminal of the sampling capacitor $C_S$, i.e. the changeover switch 61 connects $V_{in}$ to the first terminal of the sampling capacitor $C_S$. In this phase, the switch 62 is closed, and the switch 63 connects the second terminal of the converter capacitor $C_{DAC}$ to ground. The node 67 is in this way at $V_{cm}$, and the sampling capacitor $C_S$ is charged to a voltage difference $V_{cm} - V_{in}$.

In a second sampling phase, the first terminal of the sampling capacitor $C_S$ is then connected to ground, i.e. discharged, and the switch 62 is opened. As a result, a voltage $V_y$ develops at the node 67 according to $$V_y = V_{cm} - V_{in} \frac{c_s}{c_{tot}} \quad (1)$$

wherein $C_{tot}$ is the total capacitance at the positive input of the comparator arrangement 65, i.e. $C_{tot} = C_S + C_{DAC} + C_p$, in which $C_p$ represents parasitic capacitances.

Figure 7:
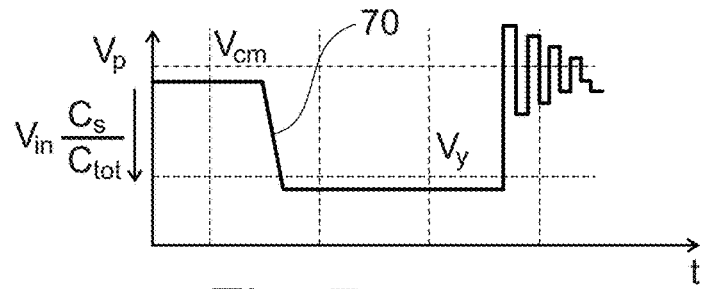
FIG. 7 is a diagram to illustrate a mode of operation of some exemplary embodiments.

A curve 70 in FIG. 7 shows the profile of the voltage $V_p$: it begins initially at $V_{cm}$ and then, after the switch 61 has been switched to ground and the switch 62 has been opened, falls to $V_y$.

During a conversion phase that is suggested on the right-hand side of FIG. 7, the capacitors of the sampling capacitor $C_{DAC}$ are switched in such a way that the voltage $V_p$ approaches $V_{cm}$. The maximum voltage difference $\Delta V_{max}$ that the digital/analog converter arrangement 64 can bring about at the input of the comparator arrangement 65 is $$\Delta V_{max} = V_{ref,out} \frac{c_{DAC}}{c_{tot}}. \quad (2)$$

By means of the voltage $\Delta V_{max}$ the least significant bit LSB can be defined as $LSB = \Delta V_{max}/2^N$ for and N-bit converter. The output code $D_y$ generated when the voltage $V_y$ is present as the voltage $V_p$ immediately before the conversion is therefore $$D_y = \frac{\text{"input"}}{LSB} = \frac{V_{cm} - V_y}{\Delta V_{max}/2^N}. \quad (3)$$

With the above equation (1) for the input voltage, we have $$Dy = \frac{V_{in} \frac{c_s}{c_{DAC}}}{V_{ref,out}/2^N}. \quad (4)$$

It can be seen from this, that a gain error can arise either from the ratio of $C_S/C_{DAC}$ or from an offset of the reference voltage $V_{ref}$.

The capacitance ratio $C_S/C_{DAC}$ and also an offset of the reference voltage $V_{ref,out}$ with respect to the reference voltage $V_{ref,in}$ can be determined with the method of FIG. 5. As already explained in connection with 50 of FIG. 5, the reference voltage is applied for this purpose to the sampling capacitor $C_S$, initially the reference voltage $V_{ref,out}$. This corresponds to the illustrated switch position of the switch 61 of FIG. 6, and can be controlled by the test controller 66.

The resulting output code $D_{out,1}$ for this case can then be written, according to equation (5), as $$D_{out@1} = \frac{V_{ref,out} \frac{c_s}{c_{DAC}}}{V_{ref,out}/2^N} = \frac{c_s}{c_{DAC}} 2^N \quad (5)$$

from which $$\frac{c_s}{c_{DAC}} = \frac{D_{out@1}}{2^N} \quad (6)$$

follows.

From the digital value $D_{out,1}$, which results from the conversion of the reference voltage $V_{ref,out}$, the capacitance ratio $C_S/C_{DAC}$ can thus be directly deduced. The above calculations can here be carried out in the test controller 66.

To measure and offset introduced by the buffer 29, $V_{ref,in}$ can also be supplied to the converter, and converted into a corresponding value $D_{out,2}$.

This conversion process runs exactly as described above for $V_{in}$.

This then leads to $$D_{out,2} = \frac{V_{ref,in} \frac{c_s}{c_{DAC}}}{V_{ref,out}/2^N} = \frac{V_{ref,in}}{V_{ref,out}} D_{out,1}; \quad (7)$$

$$\frac{V_{ref,out}}{V_{ref,in}} = \frac{D_{out@1}}{D_{out@2}}. \quad (8)$$

The ratio of the reference voltages can thus be calculated from the output codes $D_{out,1}$ and $D_{out,2}$.

The gain error can then be calculated on the basis of the above. The gain error is defined as the deviation of the last approximation step with the actual analog/digital converter from that of the ideal analog/digital converter after the offset compensation. The output code $D_{ideal}(V_{in})$ with an input voltage $V_{in}$ of an ideal analog digital converter with successive approximation, can then be written as $$D_{ideal}(V_{in}) = \frac{V_{in} \frac{c_s}{c_{DAC}}\Big|_{ideal}}{V_{ref,in}/2^N} \quad (9)$$

wherein $$\frac{c_s}{c_{DAC}}\Big|_{ideal}$$

is the ideal capacitance ratio, and the voltage $V_{ref,in}$ is the input voltage of the buffer, which means that for the ideal converter it would be true that the buffer 29 does not cause and offset, so that $V_{ref,out} = V_{ref,in}$.

The following therefore applies to the non-ideal, actual converter:

$$D_{non-ideal}(V_{in}) = \frac{V_{in} \frac{c_s}{c_{DAC}}}{V_{ref,out}/2^N}. \quad (10)$$

The gain error, measured in LSBs, is the difference between the non-ideal and the ideal output code when the input signal is at a maximum level $$V_{FS} = V_{ref,out} \frac{c_{DAC}}{c}$$

of the non-ideal converter, i.e.

$$\text{Gain error in } LSB = D_{non-ideal}(V_{FS}) - D_{ideal}(V_{FS}) \quad (11)$$

$$= 2^N \left[ 1 - \frac{V_{ref,out}}{V_{ref,in}} \frac{c_s}{c_{DAC}} \bigg|_{ideal} \frac{c_{DAC}}{c_s} \right]; \quad (12)$$

$$= 2^N \left[ 1 - \frac{c_s}{c_{DAC}} \bigg\|_{ideal} \frac{2^N}{D_{out,2}} \right]. \quad (13)$$

Only a single conversion of $V_{ref,in}$ is therefore necessary to determine the gain error.

It should be noted that in other exemplary embodiments, the reference voltages $V_{ref,in}$ or $V_{ref,out}$ are not applied directly, but rather other reference voltages that have a fixed relationship to $V_{ref,in}$ or $V_{ref,out}$ Multiples of these voltages can, for example, also be applied, and the calculations adjusted accordingly. This is also to be understood as the application of a reference voltage or as connection to a reference voltage in the sense of the present application.

Figure 8:
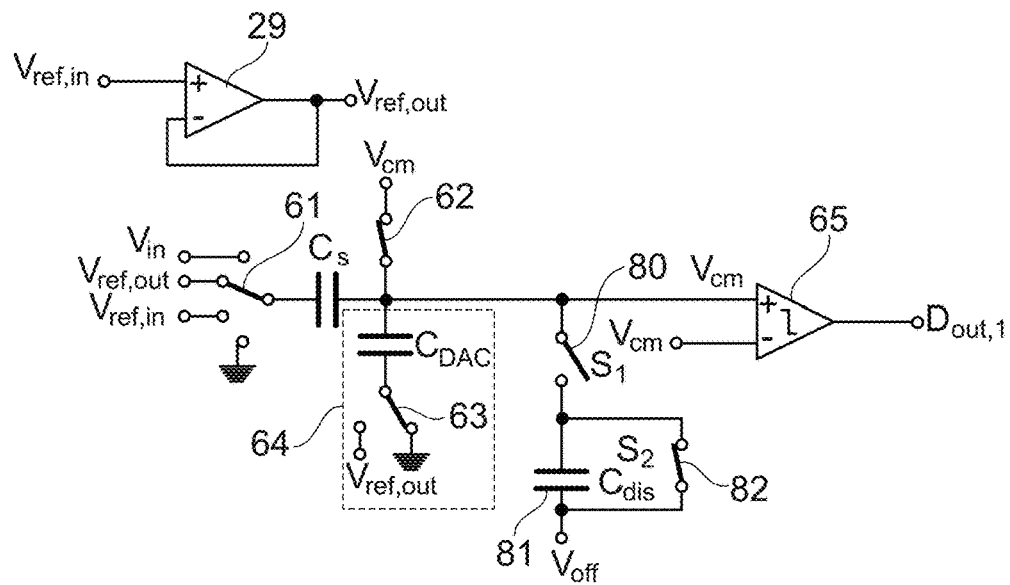
FIG. 8 is a circuit diagram of an analog/digital converter according to one exemplary embodiment.

FIG. 8 shows an alternative implementation of an analog/digital converter. Components that have already been described with reference to FIG. 6 have the same reference signs. An additional capacitor 81 and additional switches 80 and 82 are provided as illustrated in FIG. 8. Additional measurements can be illustrated with this circuit, as described in principle in U.S. Ser. No. 10/079,610 B2, with the difference that now the reference voltage $V_{ref,out}$ can be applied as described here. As a result, the output of the inbuilt self-test described in the above patent is also the capacitance ratio $C_S/C_{DAC}$. Voltages are generated here with $C_{DAC}$ by means of different switch constellations of the switch 63. This voltage is discharged with an approximately constant delta V per step, until the comparator 65 triggers, and the capacitance ratios can be determined from the number of steps required.

In this case $C_S$ is simply a further capacitance for this method. This means that if the switch 61 offers the same possibilities for connection to voltages as the switch 63 (e.g., optional connection to $V_{ref,out}$ or ground), $C_S$ is parallel to $C_{DAC}$ and can be treated, in terms of the capacitance determination, in exactly the same way as $C_{DAC}$.

Some exemplary embodiments are defined through the following examples:

Example 1

An input stage for a sampled analog/digital converter, comprising:
a first input for receiving an analog input signal,
a second input for receiving a sampling control signal,
a first transistor arrangement, wherein a first load terminal of the first transistor arrangement is coupled to the first input, a second load terminal of the first transistor arrangement is coupled to a first terminal of a sampling capacitor arrangement, and a control terminal of the first transistor arrangement is coupled to the second input,
a second transistor arrangement, wherein a second load terminal of the first transistor arrangement is coupled to the first terminal of the sampling capacitor arrangement, a second load terminal of the second transistor arrangement is coupled to a first node, and a control terminal of the second transistor arrangement is coupled to the second input, and
a switch apparatus that is configured optionally to couple the first node to ground or to a reference voltage.

Example 2

The input stage according to example 1, wherein the switch apparatus for coupling to the reference voltage is configured to couple the first node optionally with an unbuffered reference voltage or with a buffered reference voltage.

Example 3

The input stage according to example 1 or 2, wherein the switch apparatus comprises a first switch apparatus that is configured to couple the first node optionally to ground or to a second node, and a second switch apparatus that is configured to couple the second node optionally to a further ground or to the reference voltage.

Example 4

The input stage according to example 3, wherein the first switch apparatus comprises a first transistor that is coupled between the first node and ground and a second transistor that is coupled between the first node and the second node, and
wherein the second switch apparatus comprises at least one third transistor that is coupled between the second mode and the reference voltage, and a fourth transistor that is coupled between the second node and the further ground.

Example 5

The input stage according to example 2 and according to example 4, wherein the at least one third transistor is coupled between a first third transistor that is coupled between the second node and the unbuffered reference voltage, and a second third transistor that is coupled between the second node and the buffered reference voltage.

Example 6

The input stage according to one of examples 1 to 5, wherein the first transistor arrangement comprises a fourth transistor and a fifth transistor connected in series with the fourth transistor, wherein a body diode of the fourth transistor has a polarity opposite to that of a body diode of the fifth transistor.

Example 7

The input stage according to one of examples 1 to 6, wherein the first transistor arrangement and the second transistor arrangement are dimensioned for higher voltages than the switch apparatus.

Example 8

A sampled analog/digital converter, comprising:
the input stage according to one of examples 1 to 6, and
a converter core that is coupled to a second terminal of the sampling capacitor arrangement.

Example 9

The sampled analog/digital converter according to example 8, wherein the sampled analog/digital converter is an analog/digital converter with successive approximation, and further comprises a further capacitor arrangement coupled between the second terminal of the sampling capacitor arrangement and a further ground.

Example 10

A method for testing an analog/digital converter with successive approximation comprising an input node, a converter core, a sampling capacitor arrangement coupled between the input node and an input of the converter core, a further capacitor arrangement coupled between the input of the converter core and a ground, and a reference voltage generation apparatus for generating a reference voltage for the analog/digital converter, comprising:
applying the reference voltage to the input node,
converting the reference voltage into a digital value, and
determining a capacitance ratio between the sampling capacitance of the sampling capacitor arrangement and the further capacitance of the further capacitor arrangement on the basis of the digital value.

Example 11

The method according to example 10, wherein the reference voltage generation circuit is configured to generate the reference voltage as a buffered reference voltage from an unbuffered reference voltage, wherein the method further comprises:
applying the unbuffered reference voltage to the input node,
converting the unbuffered reference voltage into a further digital value, and
determining a ratio between the reference voltage and the unbuffered reference voltage on the basis of the digital value and of the further digital value.

Example 12

The method according to example 10 or 11,
further comprising determining a gain of the analog/digital converter on the basis of the digital value and/or of the further digital value.

Example 13

The method according to one of examples 10 to 12,
wherein the application of the reference voltage to the input stage according to one of examples 1 to 6 is performed, wherein the input node corresponds to the first terminal of the sampling capacitor arrangement.

Example 14

The method according to one of examples 10 to 13, further comprising:
in a normal operation of the analog/digital converter, application of an analog signal to be converted to the input node.

Example 15

An analog/digital converter with successive approximation, comprising:
an input node,
a converter core,
a sampling capacitor arrangement coupled between the input node and an input of the converter core,
a further capacitor arrangement coupled between the input of the converter core and a ground,
a reference voltage generation apparatus for generating a reference voltage for the analog/digital converter, and
a test controller that is configured to control the analog/digital converter for:
applying the reference voltage to the input node,
converting the reference voltage into a digital value, and
is configured to determine a capacitance ratio between the sampling capacitance of the sampling capacitor arrangement and the further capacitance of the further capacitor arrangement on the basis of the digital value.

Example 16

The analog/digital converter according to example 15, wherein the analog/digital converter is configured to carry out the method according to one of examples 10 to 14.

Example 17

The analog/digital converter according to example 15 or 16, further comprising the input stage according to one of examples 1 to 6.

Example 18

An input stage according to one of examples 1 to 7, analog/digital converter according to one of examples 8, 9 or 15 to 17, or method according to one of examples 10 to 14,
wherein the sampling capacitor arrangement comprises a plurality of capacitors connected in parallel.

Example 19

An analog/digital converter according to one of examples 9 or 15 to 17, or method according to one of examples 10 to 14,
wherein the further capacitor arrangement comprises a plurality of capacitors, of which respective first terminals are coupled to the terminal of the converter core, and respective second terminals can optionally be coupled to the ground or to the reference voltage.

Although specific exemplary embodiments have been illustrated and described in this description, persons with usual technical knowledge will recognize that a large number of alternatives and/or equivalent implementations can be selected as substitutes for the specific exemplary embodiments that are shown and described in this description, without leaving the scope of the disclosed invention. It is the intention that this application covers all adaptations or variations of the specific exemplary embodiments that are discussed here. It is therefore the intention that this invention is only restricted by the claims and the equivalents of the claims.

What is claimed is:

1. An input stage for a sampled analog/digital converter, comprising:
   a first input for receiving an analog input signal,
   a second input for receiving a sampling control signal,
   a first transistor arrangement, wherein a first load terminal of the first transistor arrangement is coupled to the first input, a second load terminal of the first transistor arrangement is coupled to a first terminal of a sampling capacitor arrangement, and a control terminal of the first transistor arrangement is coupled to the second input,
   a second transistor arrangement, wherein a first load terminal of the second transistor arrangement is coupled to the first terminal of the sampling capacitor arrangement, a second load terminal of the second transistor arrangement is coupled to a first node, and a control terminal of the second transistor arrangement is coupled to the second input, and
   a switch apparatus, that is configured to couple the first node optionally to ground or to a reference voltage.

2. The input stage according to claim 1, wherein the switch apparatus is configured for coupling to the reference voltage, to couple the first node optionally to an unbuffered reference voltage or to a buffered reference voltage.

3. The input stage according to claim 1, wherein the switch apparatus comprises a first switch apparatus, that is configured to couple the first node optionally to ground or to a second node, and a second switch apparatus, that is configured to couple the second node optionally to a further ground or to the reference voltage.

4. The input stage according to claim 3, wherein the first switch apparatus comprises a first transistor that is coupled between the first node and ground and a second transistor that is coupled between the first node and the second node, and
   wherein the second switch apparatus comprises at least one third transistor that is coupled between the second node and the reference voltage and a fourth transistor that is coupled between the second node and the further ground.

5. The input stage according to claim 4, wherein the at least one third transistor is coupled between a first third transistor that is coupled between the second node and an unbuffered reference voltage, and a second third transistor that is coupled between the second node and a buffered reference voltage.

6. The input stage according to claim 1, wherein the first transistor arrangement comprises a fourth transistor and a fifth transistor connected in series with the fourth transistor, wherein a body diode of the fourth transistor has a polarity opposite to that of a body diode of the fifth transistor.

7. The input stage according to claim 1, wherein the first transistor arrangement and the second transistor arrangement are dimensioned for higher voltages than the switch apparatus.

8. A sampled analog/digital converter, comprising:
   the input stage according to claim 1, and
   a converter core that is coupled to a further terminal of the sampling capacitor arrangement.

9. The sampled analog/digital converter according to claim 8, wherein the sampled analog/digital converter is an analog/digital converter with successive approximation, and further comprises a further capacitor arrangement coupled between a second terminal of the sampling capacitor arrangement and a further ground.

10. A method for testing an analog/digital converter with successive approximation comprising an input node, a converter core, a sampling capacitor arrangement coupled between the input node and an input of the converter core, a further capacitor arrangement coupled between the input of the converter core and a ground, and a reference voltage generation apparatus for generating a reference voltage for the analog/digital converter, comprising:
    applying the reference voltage to the input node,
    converting the reference voltage into a digital value, and
    determining a capacitance ratio between a capacitance of the sampling capacitor arrangement and a further capacitance of the further capacitor arrangement on a basis of the digital value.

11. The method according to claim 10, wherein the reference voltage generation apparatus is configured to generate the reference voltage as a buffered reference voltage from an unbuffered reference voltage, wherein the method further comprises:
    applying the unbuffered reference voltage to the input node,
    converting the unbuffered reference voltage into a further digital value, and
    determining a ratio between the reference voltage and the unbuffered reference voltage on the basis of the digital value and of the further digital value.

12. The method according to claim 10,
    further comprising determining a gain of the analog/digital converter on the basis of the digital value and/or of the further digital value.

13. The method according to claim 10,
    wherein the input node corresponds to a first terminal of the sampling capacitor arrangement.

14. The method according to claim 10, further comprising:
    in a normal operation of the analog/digital converter, application of an analog signal to be converted to the input node.

15. An analog/digital converter with successive approximation, comprising:
    an input node,
    a converter core,
    a sampling capacitor arrangement coupled between the input node and an input of the converter core,
    a further capacitor arrangement coupled between the input of the converter core and a ground,
    a reference voltage generation apparatus for generating a reference voltage for the analog/digital converter, and
    a test controller that is configured to control the analog/digital converter for:
    applying the reference voltage to the input node,
    converting the reference voltage into a digital value, and
    is configured to determine a capacitance ratio between a capacitance of the sampling capacitor arrangement and a further capacitance of the further capacitor arrangement on a basis of the digital value.

16. The analog/digital converter according to claim 15, wherein applying the reference voltage to the input node comprises applying an unbuffered reference voltage to the input node.

17. The analog/digital converter according to claim 15, further comprising an input stage coupled to the converter core.

18. The analog/digital converter according to claim 15, wherein the sampling capacitor arrangement comprises a plurality of capacitors connected in parallel.

19. The analog/digital converter according to claim 15, wherein the further capacitor arrangement comprises a plurality of capacitors, of which respective first terminals are coupled to the terminal of the converter core, and respective second terminals can optionally be coupled to ground or to the reference voltage.

\* \* \* \* \*